(12) United States Patent
Qi et al.

(10) Patent No.: US 9,827,562 B2
(45) Date of Patent: Nov. 28, 2017

(54) CATALYTIC CONVERTERS WITH AGE-SUPPRESSING CATALYSTS

(71) Applicant: GM GLOBAL TECHNOLOGY OPERATIONS LLC, Detroit, MI (US)

(72) Inventors: Gongshin Qi, Troy, MI (US); Ryan J. Day, Waterford, MI (US); Se H. Oh, Troy, MI (US); Xingcheng Xiao, Troy, MI (US); Ming Yang, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/247,506

(22) Filed: Aug. 25, 2016

(65) Prior Publication Data

US 2017/0095806 A1 Apr. 6, 2017

Related U.S. Application Data

(60) Provisional application No. 62/237,392, filed on Oct. 5, 2015.

(51) Int. Cl.

| | | |
|---|---|---|
| *B01D 53/94* | (2006.01) | |
| *B01J 21/04* | (2006.01) | |
| *B01J 23/44* | (2006.01) | |
| *B01J 33/00* | (2006.01) | |
| *B01J 35/00* | (2006.01) | |

(Continued)

(52) U.S. Cl.
CPC ............ *B01J 33/00* (2013.01); *B01D 53/944* (2013.01); *B01D 53/945* (2013.01); *B01J 21/04* (2013.01); *B01J 23/44* (2013.01); *B01J 35/0006* (2013.01); *B01J 35/026* (2013.01); *B01J 37/0221* (2013.01); *B01J 37/0248* (2013.01); *B01J 37/18* (2013.01); *C23C 16/45555* (2013.01); *F01N 3/101* (2013.01); *F01N 3/103* (2013.01);
(Continued)

(58) Field of Classification Search
None
See application file for complete search history.

(56) References Cited

U.S. PATENT DOCUMENTS

| | | |
|---|---|---|
| 6,022,825 A | 2/2000 | Anderson et al. |
| 7,323,432 B2 | 1/2008 | Niihara et al. |

(Continued)

FOREIGN PATENT DOCUMENTS

| | | |
|---|---|---|
| CN | 103974759 | 8/2014 |
| CN | 106560595 A | 4/2017 |

(Continued)

OTHER PUBLICATIONS

Lu et al, "A Sinter-Resistant Catalytic System Fabricated by Maneuvering the Selectivity of SiO2 Deposition onto the TiO2 Surface versus the Pt Nanoparticle Surface," Nano Letters, 13, pp. 4957-4962 (Year: 2013).*

(Continued)

*Primary Examiner* — Colin W. Slifka
(74) *Attorney, Agent, or Firm* — Harness, Dickey & Pierce, P.L.C.

(57) ABSTRACT

A catalytic converter includes a catalyst. The catalyst includes a support, platinum group metal (PGM) particles dispersed on the support, and a barrier formed on the support. The barrier is disposed between a first set of the PGM particles and a second set of the PGM particles to suppress aging of the PGM particles.

18 Claims, 4 Drawing Sheets

(51) Int. Cl.
*B01J 35/02* (2006.01)
*B01J 37/02* (2006.01)
*B01J 37/18* (2006.01)
*C23C 16/455* (2006.01)
*F01N 3/10* (2006.01)

(52) U.S. Cl.
CPC .. *B01D 2255/1023* (2013.01); *F01N 2330/06* (2013.01); *F01N 2330/14* (2013.01)

(56) References Cited

U.S. PATENT DOCUMENTS

| | | | |
|---|---|---|---|
| 8,211,392 | B2 | 7/2012 | Grubert et al. |
| 8,349,761 | B2 | 1/2013 | Xia et al. |
| 8,992,869 | B2 | 3/2015 | Ratts et al. |
| 2002/0082163 | A1 | 6/2002 | Yan et al. |
| 2009/0041645 | A1 | 2/2009 | Wassermann et al. |
| 2010/0086832 | A1 | 4/2010 | Lopez et al. |
| 2010/0204518 | A1 | 8/2010 | Wolf et al. |
| 2011/0223096 | A1 | 9/2011 | Wolf et al. |
| 2013/0034472 | A1 | 2/2013 | Cantrell et al. |
| 2014/0057781 | A1 | 2/2014 | Stamm Masias et al. |
| 2015/0231566 | A1 | 8/2015 | Xu et al. |
| 2015/0266014 | A1 | 9/2015 | Xue et al. |

FOREIGN PATENT DOCUMENTS

| | | |
|---|---|---|
| DE | 102016219133 A1 | 4/2017 |
| EP | 0695580 | 3/2003 |
| GB | 2522978 | 8/2015 |
| JP | 2006192357 | 7/2006 |
| JP | 2009247968 | 10/2009 |
| JP | 2011230104 | 11/2011 |
| JP | 05747952 | 7/2015 |
| JP | 05806536 | 11/2015 |
| KR | 2011001004 | 1/2011 |
| KR | 1092606 | 12/2011 |
| WO | WO2007063615 | 6/2007 |
| WO | WO2013182302 | 12/2013 |

OTHER PUBLICATIONS

Chen, et al. "Development of low temperature three-way catalysts for future fuel effecient vehicles"; Johnson Matthey Technol. Rev.; 2015; vol. 59; (1); pp. 64-67.

Chang, et al.; "Gasoline cold start concept (gCSC) technology for low temperature emission control"; SAE Int. J. Fuels Labr. 7(2); 2014 pp. 480-488.

Dai, et al.; "A sinter-resistant Catalytic system based on platinum nanoparticles supported on TiO2 nanofibers and covered by porous silica"; Angew. Chem.Int. Ed.; 2010; vol. 49 pp. 8165-8168.

Lu, et al.; "Coking- and sintering-resistant palladium catalysts achieved through atomic layer deposition" Science; 2012; vol. 335; No. 6073; pp. 1205-1208 Abstract Only.

Pan, et al. "Effect of alumina on structure and acidity of solid acid catalyst Pt-SO_4~(2-)/ZrO_2-Al_20_3"; Chinese Journal of Catalysis; 2005; Abstract Only.

Wang; "Fabrication and testing of low-temperature catalytically active washcoat materials for next-generation vehicle catalytic converters"; YSU-CTME; 2013; pp. 1-9.

Li, et al.; "A sintering-resistant Pd/SiO2 catalyst by reverse-loading nano iron oxide for aerobic oxidation of benzyl alcohol"; RSC Advances; 2015; vol. 5; pp. 4766-4769; Abstract Only.

Lu, et al.; A sinter-resistant catalytic system fabricated by maneuvering the selectivity of␣Si02 deposition onto the Tio2 surface versus the pt nanoparticle surface Nano Lett.; 2013; vol. 13 (10); pp. 4957-4962; Abstract Only.

* cited by examiner

CATALYTIC CONVERTERS WITH AGE-SUPPRESSING CATALYSTS

CROSS-REFERENCE TO RELATED APPLICATIONS

This application claims the benefit of U.S. Provisional Application Ser. No. 62/237,392, filed Oct. 5, 2015, which is incorporated by reference herein in its entirety.

TECHNICAL FIELD

The present disclosure relates generally to catalytic converters, and more specifically to age-suppressing catalysts.

BACKGROUND

Vehicles with an Internal Combustion Engine (ICE) include an exhaust gas treatment system for treating the exhaust gas from the engine. The configuration of the treatment system depends, in part, upon whether the engine is a diesel engine (which typically operates with lean burn combustion and contains high concentrations of oxygen in the exhaust gases at all operating conditions) or a stoichiometric spark-ignited engine (which operates at a nearly stoichiometric air-to-fuel (A/F) ratio). The treatment system for the diesel engine includes a diesel oxidation catalyst (DOC), which is capable of oxidizing carbon monoxide (CO) and hydrocarbons (HC). The treatment system for the stoichiometric spark-ignited engine includes a three-way catalyst (TWC), which operates on the principle of non-selective catalytic reduction of $NO_x$ by CO and HC.

SUMMARY

A catalytic converter includes a catalyst. The catalyst includes a support, platinum group metal (PGM) particles dispersed on the support, and a barrier formed on the support. The barrier is disposed between a first set of the PGM particles and a second set of the PGM particles to suppress aging of the PGM particles.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Figure 1:
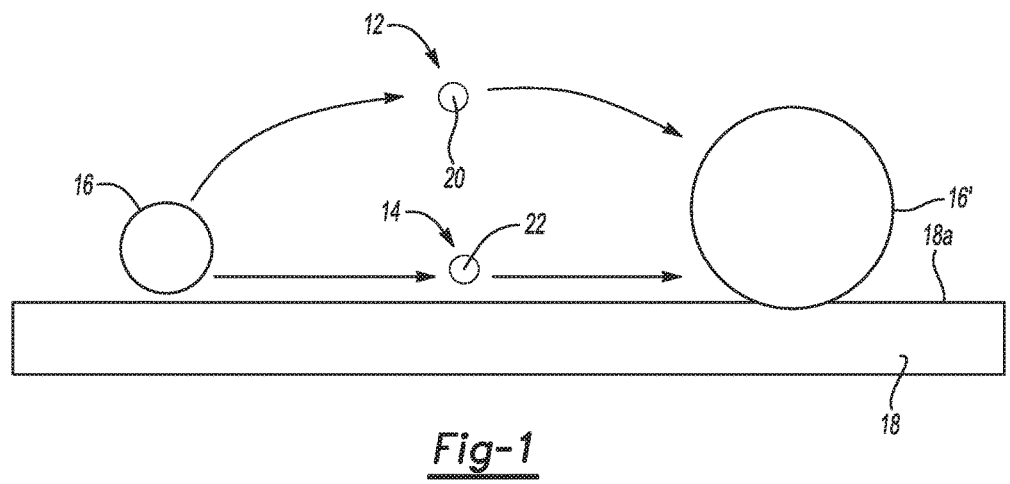
FIG. 1 is a schematic illustration depicting two mechanisms for PGM particle growth or sintering.

DOCs and TWCs often include a support loaded with a Platinum Group Metal (PGM) as the active catalytic/catalyst material. As the exhaust gas temperature from the vehicle engine increases (e.g., to temperatures ranging from 150° C. to about 1000° C.), the PGM loaded on the support may experience particle growth (i.e., sintering). FIG. 1 depicts two mechanisms for PGM particle growth during vehicle operation. The mechanisms involve atomic and/or crystallite PGM migration. The first mechanism involves PGM migration via a vapor phase, denoted 12, and the second mechanism involves PGM migration via surface diffusion, denoted 14. In the first mechanism, a mobile species (not shown), emitted from the PGM particles 16 loaded on the support 18, can travel through the vapor phase 12 and agglomerate with other metal particles 20 in the vapor phase 12 to form larger PGM particles 16'. In the second mechanism, a mobile species (not shown) emitted from the PGM particles 16 can diffuse along the surface 18a of the support 18 and agglomerate with other metal particles 22 on the surface 18a to form larger PGM particles 16'.

An increase in the size of the PGM particles 16' results in poor PGM utilization and undesirable aging of the catalyst material. More specifically, the increased particle size reduces the PGM dispersion, which is a ratio of the number of surface PGM atoms in the catalyst to the total number of PGM atoms in the catalyst. A reduced PGM dispersion is directly related to a decrease in the active metal surface area (as a result of particle growth), and thus indicates a loss in active catalyst reaction sites. The loss in active catalyst reaction sites leads to poor PGM utilization efficiency, and indicates that the catalyst has undesirably been aged or deactivated.

It has been observed that about 1% of the PGM in a typical TWC remains catalytically active after 100,000 to 150,000 miles of driving (i.e., 99% of the PGM is wasted). One approach to counteract the effect of sintering is to use a high enough PGM loading to compensate for the catalyst deactivation. However, this increases the cost of the TWC.

The catalysts disclosed herein suppress aging by physically separating the PGM particles 16 with a barrier formed on the support 18. By physically separating the PGM particles 16, the barrier aims to block vapor phase migration and surface diffusion. This slows down or prevents the PGM particle growth/sintering and maintains more active PGM sites over time, and thus the catalyst ages slower than catalysts without the barrier. Moreover, when sintering is reduced or prevented, the operational temperature of the catalyst is prevented from drifting upward over time.

Figure 2A:
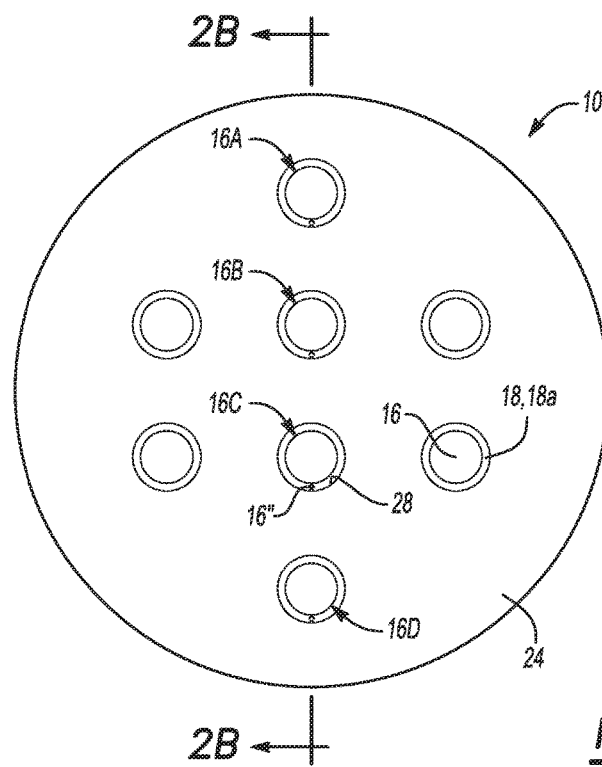
FIG. 2A is a semi-schematic, top view of an example of a catalyst disclosed herein.
Figure 2B:
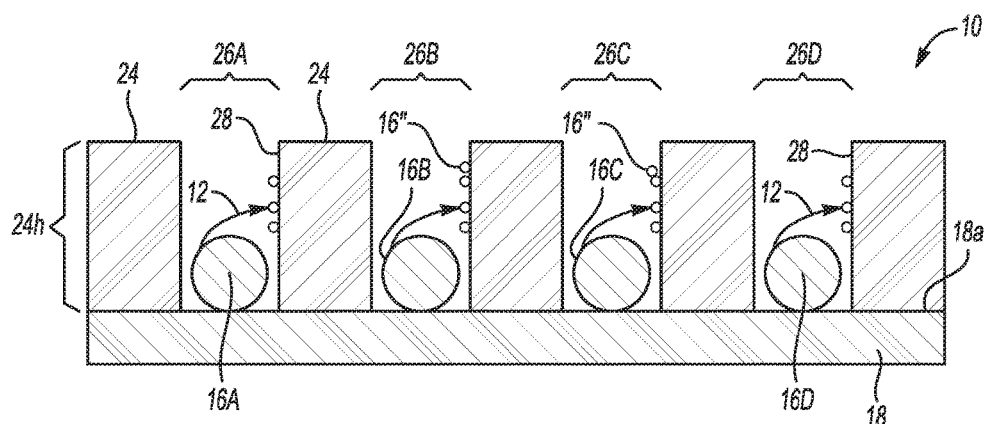
FIG. 2B is a semi-schematic, cross-sectional view taken along line 2B-2B of the catalyst shown in FIG. 2A.

Referring now to FIGS. 2A and 2B, an example of the catalyst 10 is depicted. More specifically, FIG. 2A depicts a top view of the catalyst 10, and FIG. 2B depicts a cross-sectional view of the catalyst 10.

The catalyst 10 includes the support 18. The support 18 may be a porous metal oxide structure. The porous metal oxide structure may be formed of $Al_2O_3$, $CeO_2$, $ZrO_2$, $CeO_2$—$ZrO_2$, $SiO_2$, $TiO_2$, MgO, ZnO, BaO, $K_2O$, $Na_2O$, CaO, or combinations thereof. The porous metal oxide structure may be in the form of a powder, spheres, or any other suitable configuration. The support 18 may include several small pores. More pores increase the surface area to fit many PGM particles 16 in a small volume. In an example, the pore volume of the support 18 ranges from about 0.5 ml/g to about 2 ml/g.

The catalyst 10 also includes PGM particles 16 dispersed on the support 18. By "dispersed on", it is meant that the PGM particles 16 may be bonded to the surface 18a of the support 18, and may also be present within the pores (not shown) of the support 18.

Each instance or occurrence of the PGM particles 16 on the surface 18a of the support is referred to herein as a set of PGM particles. While several sets are shown, four of the sets are labeled as 16A, 16B, 16C, and 16D in FIGS. 2A and 2B. While the sets 16A, 16B, 16C, and 16D are illustrated as being made up of a single PGM particle 16, it is to be understood that the sets 16A, 16B, 16C, and 16D may each be made up of a single PGM particle or several PGM particles 16 agglomerated together. For example, each set 16A, 16B, 16C, 16D may include a small cluster of the particles 16, with the particles 16 being similarly sized or having a distribution in particle size. For another example, each set 16A, 16B, 16C, 16D may include an individual particle 16 that is isolated from each other individual particle 16 by the barrier 24.

The PGM particles 16 are formed of active catalytic material, and may be palladium (Pd), platinum (Pt), rhodium (Rh), ruthenium (Ru), osmium (Os), iridium (Ir), or various combinations thereof (e.g., Pd and Pt, Pt and Rh, Pd and Rh, Pd, Pt and Rh, Pt and Ir, Pd and Os, or any other combination). The PGM particles 16 are present in the catalyst 10 in an amount ranging from about 0.1 wt % to about 10 wt % of the catalyst 10.

The catalyst 10 also includes the barrier 24 formed on at least some of the surface 18a of the support 18 (e.g., on those area where the PGM particles 16 are not present). As shown in FIG. 2B, the barrier 24 physically separates each PGM particle set 16A, 16B, 16C, and 16D from each other PGM particle set 16A, 16B, 16C, and 16D. The barrier 24 essentially forms a wall between the PGM catalyst particle sets 16A, 16B, 16C, and 16D on the surface 18a of the support 18, and functions to prevent the particles 16 from agglomerating through either the vapor phase 12 or surface diffusion 22. The barrier 24 does not extend onto any of the PGM particles 16, and thus the PGM particles 16 can be exposed directly to the exhaust gas during vehicle operation. As shown in FIG. 2A, the barrier 24 may be a continuous coating formed around each of the PGM particle sets 16A, 16B, 16C, and 16D.

The barrier 24 may be any of $Al_2O_3$, $CeO_2$, $ZrO_2$, $CeO_2$—$ZrO_2$, $SiO_2$, $TiO_2$, MgO, ZnO, BaO, $K_2O$, $Na_2O$, CaO, or combinations thereof. In an example, the support 18 is $CeO_2/Al_2O_3$, and the barrier 24 is $Al_2O_3$.

To prevent particle 16 migration, the barrier 24 has a height 24h that ranges from about 0.05X to about 10X, where X is a dimension of at least one of the PGM particle sets 16A, 16B, 16C, and 16D. In an example, the dimension of at least one of the PGM particles sets 16A, 16B, 16C, and 16D is a diameter or width of a single particle 16 or of an agglomeration/cluster of particles 16. In another example, the dimension of at least one of the PGM particles sets 16A, 16B, 16C, and 16D is a height of a single particle 16 or an agglomeration/cluster of particles 16. The height 24h of the barrier 24 may be selected so that the barrier 24 is tall enough to prevent or suppress migration, and short enough so that the barrier 24 does not begin to cover the neighboring PGM particle(s) 16 and does not impede access of the exhaust gas to the PGM particles 16. In an example, if the particle size ranges from about 3 nm to about 5 nm, the height 24h of the barrier may range from about 0.15 nm (0.05×3) to about 50 nm (10×5).

The barrier 24 also creates spaces 26A, 26B, 26C, 26D, each of which is occupied by a respective PGM particle set 16A, 16B, 16C, 16D. The height of the space 26A, 26B, 26C, 26D corresponds with the height 24h of the barrier 24, while at least one other dimension (e.g., length, width, diameter, or the like) of the spaces 26A, 26B, 26C, 26D depends on the size of the respective PGM particle sets 16A, 16B, 16C, 16D. In an example, the dimension(s) (other than height) of the spaces 26A, 26B, 26C, 26D is/are up to about 100 nm, which can accommodate larger particles 16 or particle agglomerations/clusters. In another example, the dimension(s) (other than height) of the spaces 26A, 26B, 26C, 26D ranges from about 3 nm to about 5 nm.

The barrier 24 blocks surface diffusion of PGM particles 16. Further, the barrier 24 suppresses PGM growth via vapor phase migration. Any mobile species from the PGM particles 16 that migrates via the vapor phase 12 may become deposited (as particles 16") on the side walls 28 of the barrier 24. These PGM particles 16" remain catalytically active.

The catalyst 10 may be formed by applying the PGM particles 16 to the support 18, removing or passivating a functional group on the surface of the PGM particles 16, and selectively growing the barrier 24 on the support 18 around the PGM particles 16.

In one example of forming the catalyst 10, the support 18 may be pre-sintered at a temperature ranging from about 900° C. to about 1000° C. Pre-sintering may reduce the surface area of the support 18 prior to formation of the barrier 24. Reducing the surface area of the support 18 means that there may be less of the surface 18a available for the growth of the barrier 24 (and thus less of the barrier 24). Less barrier 24 material reduces the weight increase of the final catalyst 10.

The PGM particles 16 may be applied to the support 18 using a dry impregnation process. Impregnating the PGM particles 16 onto the support utilizes a PGM precursor solution. The PGM precursor solution may be an aqueous solution containing water and a PGM precursor. Any number of PGM containing coordination complexes can be used as the PGM precursor. Some example PGM precursors include chloroplatinic acid (CPA), tetraammineplatinum chloride (or nitrate or hydroxide), platinum nitrate, platinum acetate, dinitrodiamine platinum, palladium nitrate, palladium acetate, bis-acetylacetonato palladium, rhodium nitrate, rhodium acetate, etc. PGM precursors of ruthenium, osmium, and/or iridium may also be used. Examples of the PGM precursor solution include a platinum nitrate solution, a platinum acetate solution, a palladium nitrate solution, a palladium acetate solution, a rhodium nitrate solution, a rhodium acetate solution, or combinations thereof. The combinations may be used to form mixtures of different types of PGM particles 16 (e.g., a mixture of platinum and palladium particles).

The concentration of the precursor solution depends upon the desired loading of the PGM particles 16 on the support 18 and in the catalyst 10. For example, 10 g total of the catalyst 10 with 1.5% platinum equates to 0.15 g platinum (i.e., 1.5% of 10 g). The mass ratio of pure platinum to platinum precursor may be used to determine how much of the platinum precursor should be used to achieve the desired mass of platinum for the catalyst 10. The total amount of water added to make the aqueous solution depends upon the volume of water that will achieve incipient wetness. This solution may be added to 9.85 g of dried support (i.e., 10 g total−0.15 g platinum=g support).

The PGM precursor solution is added to the support 18 until all of the pores of the support 18 are filled with the solution. In some instances, no additional solution is added beyond the amount needed to fill the pores (i.e., incipient wetness).

The impregnated support 18 is then exposed to drying and calcining to convert the PGM precursor to the PGM particles 16. In an example, drying is performed in air for a time period ranging from about 12 hours to about 24 hours, and calcining is performed at a temperature of about 550° C. for a time period of about 2 hours. This process decomposes the PGM precursor and forms the PGM particles 16 both within the pores of the support 18 and on at least some of the surface 18a of the support 18.

The PGM particles 16 are then exposed to a process that will render the particles 16 non-reactive during a subsequent barrier formation process (i.e., selective growth process). In an example, this process reduces functional group(s) on the surface of the PGM particles 16 so that the PGM particles 16 will not react during the subsequent barrier formation process. For example, both atomic layer deposition (ALD) and molecular layer deposition (MLD) need OH (hydroxyl) functional groups to react. By removing the OH groups from the PGM particles 16, the reactions that take place during ALD or MLD will not occur on the PGM particles 16. The reduction process may be used to prepare the PGM particles 16 for any subsequent barrier formation process that utilizes OH groups for reaction.

This reduction process also does not deleteriously affect the exposed surface 18a of the support 18 (i.e., functional group(s) on the surface 18a remain reactive). The process may involve exposing the PGM particles 16 on (and in) the support 18 to a reducing environment at a temperature up to 400° C. for a time ranging from about 0.5 hours to about 10 hours. The reducing environment may be hydrogen gas, carbon monoxide (CO) gas, or may include a mixture of argon gas and hydrogen gas or CO gas. In one example, hydroxyl (OH) functional groups on the surface of the PGM particles 16 are reduced to form water, which is evaporated as a result of the high temperature.

The barrier 24 may then be formed on the exposed portions of the surface 18a of the support 18. The barrier 24 may be formed via atomic layer deposition (ALD), molecular layer deposition (MLD), or any other selective deposition process that utilizes OH groups for reaction.

Each of these processes is self-limiting, because they involve sequential surface chemical reactions with certain functional groups. Since the PGM particles 16 have been treated to reduce or otherwise remove the reactive functional groups used throughout the ALD or MLD processes, the barrier 24 does not form on the PGM particles 16.

During ALD and MLD, the barrier material may grow anywhere an OH functional group is present. The ALD and MLD cycles may introduce reactive OH functional groups to the PGM particles 16. The previously described reduction process may be performed after each ALD or MLD cycle and before the next ALD or MLD cycle in order to clean the PGM particles 16 by removing OH groups. It is to be understood that the temperature used during the reduction process is not high enough to remove the OH groups from the barrier 24. In this example, the ALD or MLD cycle and the reduction processes are repeatedly performed to create the barrier 24 around, but not on, the PGM particles 16.

Moreover, it has been found that controlling the barrier height 24a is desirable. First, if the height 24h of the barrier 24 extends too far above the height of the particles 16 (e.g., >10X, as described above), the exhaust gas may not be able to reach the PGM particles 16 and catalysis will not work. Second, if the barrier 24 is grown much higher than the adjacent PGM particles 16, then the chemicals used during additional cycles of ALD or MLD will react with OH groups above the PGM particles 16 (e.g., on the now exposed sides of the barrier 24). This causes the barrier 24 to grow inward and cover or encapsulate the particles 16. As such, the number of cycles of ALD or MLD may be controlled in order to achieve the desired height 24h for the barrier 24. For example, when ALD is used to create the barrier 24, less than 20 ALD cycles may be used. As one specific example, from 5 ALD cycles to 10 ALD cycles may be used to create the barrier 24.

Each of ALD and MLD forms a conformal (or continuous) coating on the exposed surface 18a. These processes precisely control the thickness of each layer that is formed. For example, 1 cycle of ALD creates a conformal coating having a thickness of about 1.1 Angstroms.

Figure 3:
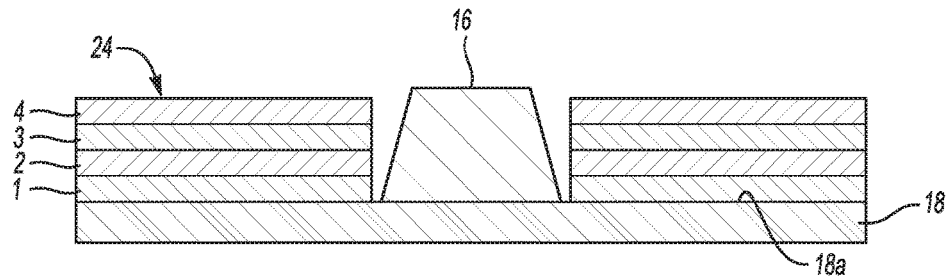
FIG. 3 is a semi-schematic, cross-sectional view depicting an example of the catalyst disclosed herein formed via selective atomic layer deposition (ALD)

FIG. 3 illustrates an example barrier 24 formed via ALD. In this example, the barrier 24 that is formed is made up of several $Al_2O_3$ layers 1, 2, 3, 4 and the support 18 is $CeO_2/Al_2O_3$. The PGM particles 16 have already been formed and reduced on the surface 18a.

The starting components for the ALD process used to form $Al_2O_3$ layers may include trimethyl aluminum and water. The overall reaction is shown as reaction (1) and the half-reactions are shown as reactions (2) and (3):

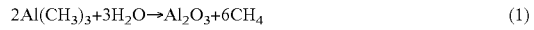

$$2Al(CH_3)_3 + 3H_2O \rightarrow Al_2O_3 + 6CH_4 \tag{1}$$

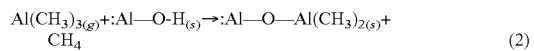

$$Al(CH_3)_{3(g)} + :Al\text{—}O\text{—}H_{(s)} \rightarrow :Al\text{—}O\text{—}Al(CH_3)_{2(s)} + CH_4 \tag{2}$$

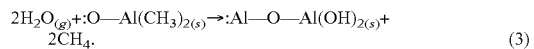

$$2H_2O_{(g)} + :O\text{—}Al(CH_3)_{2(s)} \rightarrow :Al\text{—}O\text{—}Al(OH)_{2(s)} + 2CH_4. \tag{3}$$

The reaction during ALD relies on the presence of —OH bonds on the surface of the support 18. The nature of the ALD process is that it deposits one monolayer per cycle. Over many cycles, alternating layers of oxygen and aluminum are formed, resulting in a hydroxylated $Al_2O_3$ surface. As noted above, ALD is a self-limiting surface reaction process. For example, in the first half cycle, $Al(CH_3)_3$ reacts with —OH groups on the support 18, and forms Al—$(CH)_2$ on the exposed portions of the surface 18a. Then, water is introduced, which reacts with Al—$(CH)_2$ and forms Al—OH again. After this, one cycle is completed and a layer of $Al_2O_3$ is formed. The process is repeated to form several layers of $Al_2O_3$ and to create the barrier 24. As illustrated in FIG. 3, the alumina layers 1, 2, 3, 4 formed by the ALD process will selectively deposit on the support surface 18a, and there will be no alumina layers 1, 2, 3, 4 formed by the ALD process covering the PGM particle 16. This is due to the presence of —OH groups, initially on the surface 18a and subsequently on each layer, and the absence of —OH groups on the PGM particle 16.

In order to complete the selective ALD process (or MLD or other selective growth process that utilizes OH groups), the PGM particle(s) 16 should be maintained as a metal state (not a metal oxide state), so as to avoid any —OH groups or other species that could initiate barrier material growth. In an example, this is accomplished by integrating the reduction process between ALD cycles. Alternatively, the number of cycles performed may be limited to prevent growth over the PGM particles 16.

The methods disclosed herein may also be used to maintain the operational temperature of the catalyst 10 over time, and of a catalytic converter in which the catalyst 10 is used.

Figure 4A:
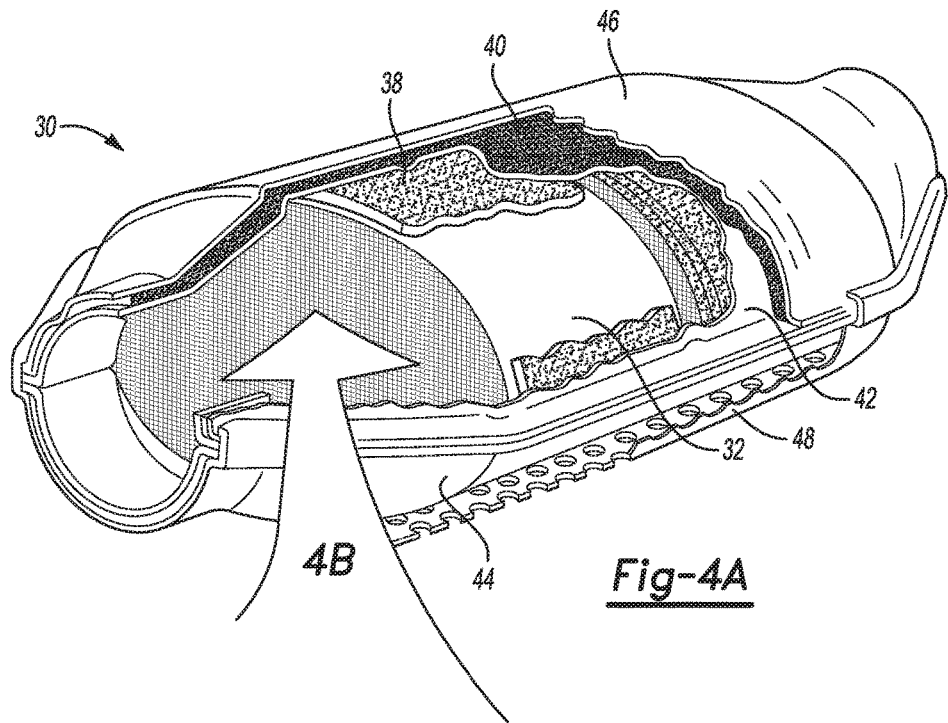
FIG. 4A is a perspective, partially cut-away view of an example of a catalytic converter.

The catalyst 10 may be applied to a monolith substrate and utilized in a catalytic converter. An example of the catalytic converter is shown in FIG. 4A and an example of the monolith substrate is shown in both FIGS. 4A and 4B.

The catalytic converter 30 includes the monolith substrate 32. The monolith substrate 32 may be formed of a ceramic or a metal alloy that is capable of withstanding high temperatures (e.g., 100° C. or higher). Synthetic cordierite is a magnesium-alumino-silicate ceramic material that is suitable for use as the monolith substrate 32. A ferritic iron-chromium-aluminum alloy is an example of a metal alloy that is suitable for use as the monolith substrate 32. The monolith substrate 32 has a honeycomb or other three-dimensional structure.

Figure 4B:
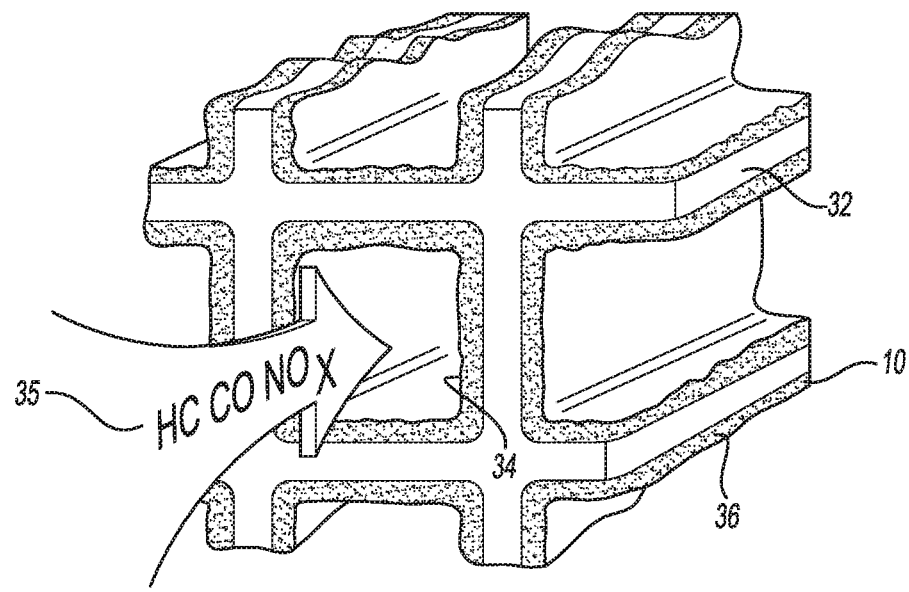
FIG. 4B is an enlarged view of a portion of FIG. 4A.

An enlarged view of a portion of the monolith substrate 32 is depicted in FIG. 4B. The monolith substrate 32 includes a large number of parallel flow channels 34 to allow for sufficient contact area between the exhaust gas 35 and the catalyst 10 (contained in coating 36) without creating excess pressure losses.

The coating 36 includes the catalyst 10 disclosed herein. In some instances, the coating 36 may also include a binder material (e.g., sol binders or the like). The coating 36 may be applied to the monolith substrate 32 by washcoating or some other similar processes.

Referring back to FIG. 4A, in the catalytic converter 30, the monolith substrate 32 is surrounded by a mat 38, which in turn is surrounded by insulation 40. Upper and lower shells 42, 44 (formed of metal) may be positioned between the mat 38 and the insulation 40. An insulation cover 46 may be positioned over the upper shell 42 and the insulation 40 thereon, and a shield 48 may be positioned adjacent to the lower shell 44 and the insulation 40.

The catalytic converter 30 may be a DOC, which is used in a diesel engine. The DOC is a two way catalytic converter, which eliminates hydrocarbons and CO by oxidizing them, respectively, to water and $CO_2$. The DOC may also exhibit $NO_x$ storage capability during the vehicle cold-start period. In such diesel engines, the reduction of $NO_x$ to water and $N_2$ may take place in a separate unit, and may involve the injection of urea into the exhaust. In an example, the carbon monoxide (CO) light-off temperature (measured at $T_{50}$, or the temperature at which 50% conversion of CO is achieved) of the DOC is 226° C. or less and the hydrocarbon light-off temperature (measured at $T_{50}$, or the temperature at which 50% conversion of $C_3H_6$ is achieved) of the DOC is 253° C. or less.

The catalytic converter 30 may also be a TWC, which is used in a stoichiometric spark-ignited engine. The TWC is a three way catalytic converter, which reduces NOx to $N_2$, and oxidizes HC and CO, respectively, to water and $CO_2$.

To further illustrate the present disclosure, examples are given herein. It is to be understood that these examples are provided for illustrative purposes and are not to be construed as limiting the scope of the present disclosure.

Example 1

This example was performed to test the effect of various numbers of ALD cycles on palladium dispersion.

All of the samples included an alumina support with palladium particles loaded thereon via a dry impregnation process. During this process, an aqueous solution of a palladium nitrite was added to alumina power until all of the pores of the alumina powder were filled. Excess solution was not added. The impregnated powders were dried in air overnight, and then calcined in air at 550° C. for 2 hours to decompose the palladium precursor and form the palladium particles.

The baseline sample was the alumina support with the palladium particles loaded thereon. The baseline sample was not exposed to any ALD cycles.

The other samples were exposed to OH reduction and various cycles of ALD to form an alumina barrier on the exposed surfaces of the alumina support. One example was exposed to reduction and 5 ALD cycles (referred to as 5 ALD cycle sample), another example was exposed to reduction and 10 ALD cycles (referred to as 10 ALD cycle sample), and still another example was exposed to reduction and 20 ALD cycles (referred to as 20 ALD cycle sample). The reduction and ALD conditions were as follows: the respective samples (i.e., the alumina support with the palladium particles loaded thereon) were reduced for 1 hour in 3% $H_2$ at 250° C. and 5 torr; the samples were then cooled to 180° C. and 5 torr before flowing alternating gas phase pulses of trimethylaluminum (TMA) and $H_2O$ over the samples; the gases flowed until the reaction was shown to be complete based on values from a mass spectrometer.

The palladium dispersion (i.e., the ratio of the number of surface Pd atoms to the total number of Pd atoms) for each sample was determined by chemisorption. Using chemisorption, the adsorption of a molecule (like CO or $H_2$) onto the PGM metal is measured. This measurement and the total mass of PGM in the sample enables the determination as to how much PGM is on the surface. Generally, the higher the dispersion, the higher the PGM utilization efficiency during catalyst operation.

Figure 5A:
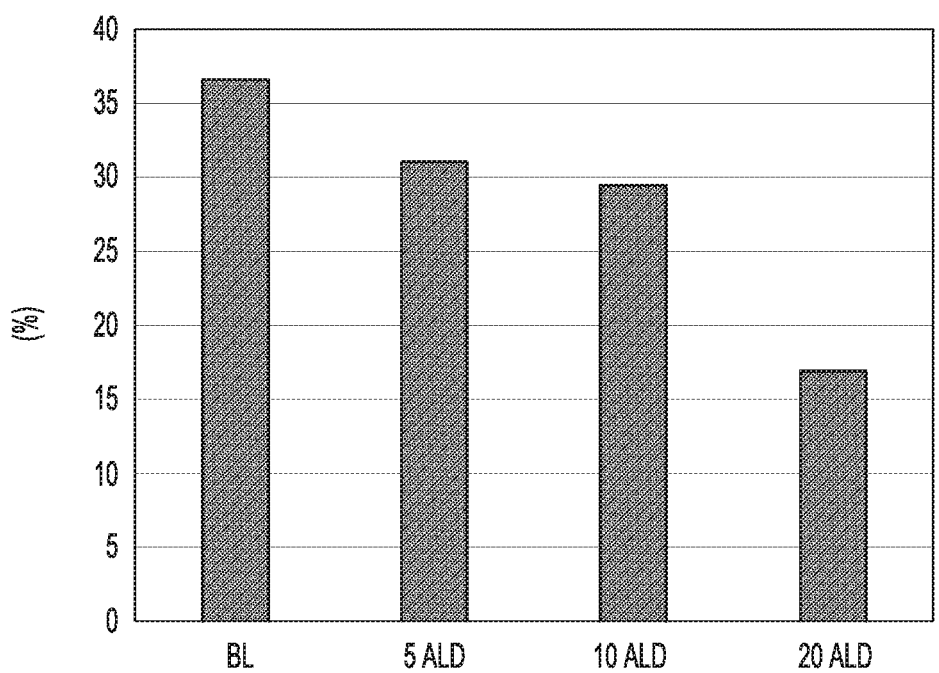
FIG. 5A is a graph depicting the palladium dispersion (i.e., the ratio of the number of surface metal atoms to the total number of metal atoms, shown as a percentage) for a baseline example (BL), and examples exposed to a different number of cycles of atomic layer deposition (# ALD)

The palladium dispersion results are shown in FIG. 5A. As depicted, the baseline example (labeled "BL", no barrier) had a palladium dispersion of about 36%, while the 5 and 10 ALD cycle samples (respectively labeled "5 ALD" and "10 ALD") had a palladium dispersion of about 31% and 29%, respectively. The 5 and 10 ALD cycle samples have a palladium dispersion that is close to the palladium dispersion of the baseline, which indicates that the ALD alumina (i.e., the barrier) was selectively grown on the alumina support and not on the palladium particles.

The palladium dispersion of the 20 ALD cycle sample (labeled "20 ALD") was significantly reduced (to about 17%) when compared to the baseline sample, which indicates that the ALD alumina was beginning to form on, or cover up, some of the palladium particles.

Based on these results, less than 20 ALD cycles may be used to form the barrier layer disclosed herein and to obtain a suitable PGM dispersion. The 5 and 10 ALD cycle samples included from about 10 wt % to about 20 wt % of alumina barrier coating. Alternatively, the reduction process could have been repeated between ALD cycles.

Example 2

The baseline sample and the 5 and 10 ALD cycle samples from Example 1 were exposed to an aging process. The aging process involved exposing the samples to 950° C. for 2 hours in air with 10% water added.

The palladium dispersion for each aged sample was determined by chemisorption. Generally, the higher the dispersion, the higher the PGM utilization efficiency during catalyst operation.

Figure 5B:
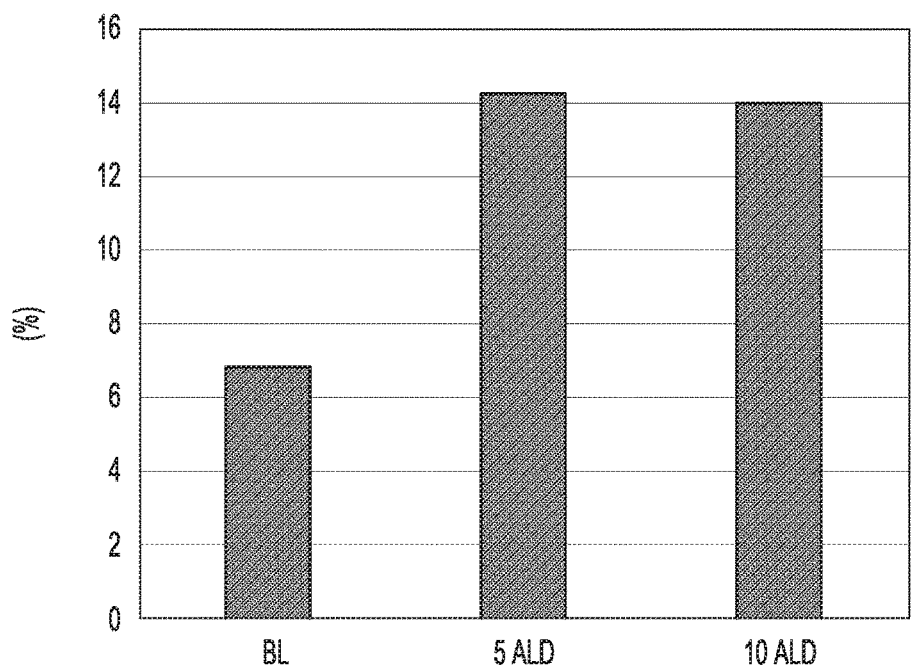
FIG. 5B is a graph depicting the palladium dispersion (shown as a percentage) for a baseline example (BL), an example including a barrier formed from 5 ALD cycles (5 ALD), and an example including a barrier formed from 10 ALD cycles (10 ALD), after being exposed to an aging process.

The palladium dispersion results for the aged samples are shown in FIG. 5B. As depicted, the baseline example (BL, no ALD alumina barrier) had a palladium dispersion of about 6%, which was significantly reduced compared to the palladium dispersion of the non-aged (or fresh) baseline sample (see BL in FIG. 5A). This reduction in the palladium dispersion indicates that the palladium particles have undergone sintering and particle growth, and that there are less surface palladium atoms available. Also as depicted, each of the aged 5 and 10 ALD cycle samples (respectively labeled "5 ALD" and "10 ALD") had a palladium dispersion of about 14%. The palladium dispersion of the aged 5 and 10 ALD cycle samples was two times the palladium dispersion of the aged baseline sample. This indicates that the alumina barriers formed from 5 and 10 ALD cycles suppressed the migration of the palladium particles and of the individual palladium atoms.

Example 3

A baseline sample including palladium loaded onto an alumina support and no exposure to ALD was formed in the same manner as described in Example 1. The palladium loading was 0.63 wt %.

A 5 ALD cycle sample, including palladium loaded onto an alumina support and an alumina barrier formed from 5 ALD cycles, was formed in the same manner as described in Example 1. The palladium loading was 0.57 wt %.

The baseline and 5 ALD cycle samples were exposed to an aging process, during which they were exposed to 950° C. for 2 hours in air with 10% water added.

The baseline and 5 ALD cycle samples were then exposed to exhaust gas (containing 5000 ppm CO, 500 ppm hydrocarbons (e.g., $C_3H_6$ and $C_3H_8$), 1% $O_2$, 5% $H_2O$, and $N_2$ balance) at an inlet temperature that was ramped up at a rate of 2° C. per minute. The space velocity (SV) was 1,500,000 $cm^3$ $g_{catalyst}^{-1}$ $h^{-1}$, where space velocity refers to the quotient of the entering volumetric flow rate of the reactants divided by the reactor volume (or the catalyst bed volume) in a unit time.

The light-off temperatures of the baseline and 5 ALD cycle samples for CO and for $C_3H_6$ was determined. The light-off temperatures were measured at $T_{50}$, which is the temperature at which 50% conversion of CO or $C_3H_6$ is achieved. The lower $T_{50}$, the better.

Figure 6:
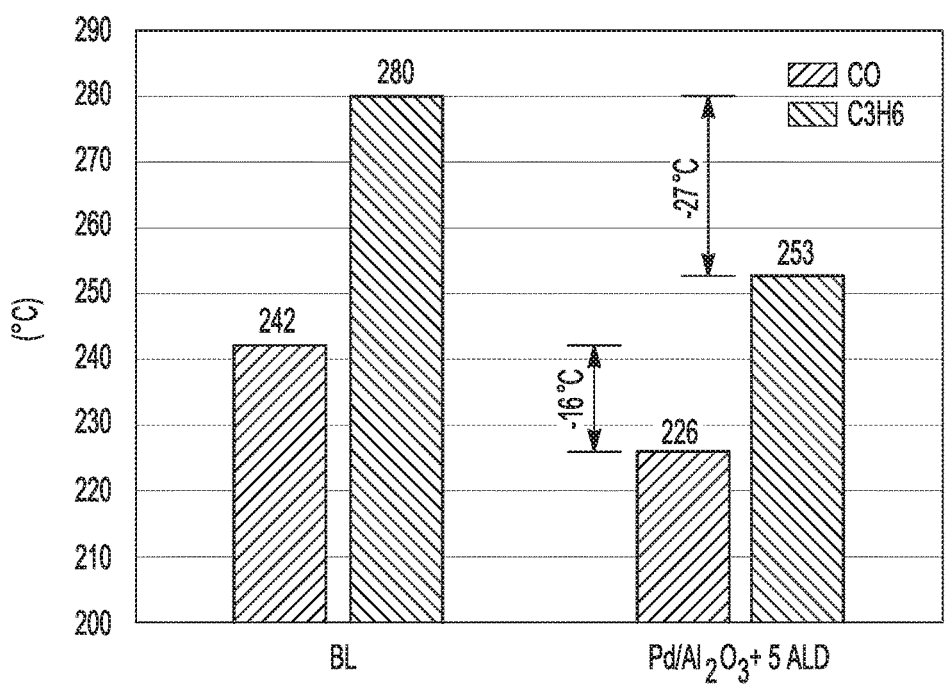
FIG. 6 is graph depicting the light-off temperature (in °C.) for carbon monoxide (CO) conversion and for $C_3H_6$ (propene or, alternatively, propylene) conversion for a baseline example (BL) and an example including a barrier formed from 5 ALD cycle ($Pd/Al_2O_3$+5 ALD).

The results are shown in FIG. 6 and in Table 1 below. As illustrated, the catalyst disclosed herein (including the barrier formed from 5 ALD cycles, labeled "Pd/$Al_2O_3$+5 ALD") exhibits lower CO and HC light-off temperatures than the baseline sample without any barrier.

TABLE I

CO and $C_3H_6$ Light-Off Temperature ($T_{50}$)

| | Baseline Sample (BL) | 5 ALD cycle sample (Pd/$Al_2O_3$ + 5 ALD) | ΔT |
|---|---|---|---|
| CO | 242° C. | 226° C. | 16° C. |
| $C_3H_6$ | 280° C. | 253° C. | 27° C. |

The drop in the light-off temperatures (ΔT ranging from about 16° C. to about 30° C.) of the sample including the barrier is advantageous, in part, because the catalyst is capable of CO and HC oxidation activity at lower temperatures. This is also expected to translate into significantly lower PGM loadings required for the same performance, which may lead to a reduction in cost of the precious metals used in the catalyst.

It is to be understood that the ranges provided herein include the stated range and any value or sub-range within the stated range. For example, a range of from about 900° C. to about 1000° C. should be interpreted to include not only the explicitly recited limits of from about 900° C. to about 1000° C., but also to include individual values, such as 925° C., 980° C., etc., and sub-ranges, such as from about 915° C. to about 975° C., etc. Furthermore, when "about" is utilized to describe a value, this is meant to encompass minor variations (up to +/−10%) from the stated value.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

In describing and claiming the examples disclosed herein, the singular forms "a", "an", and "the" include plural referents unless the context clearly dictates otherwise.

While several examples have been described in detail, it is to be understood that the disclosed examples may be modified. Therefore, the foregoing description is to be considered non-limiting.

The invention claimed is:

1. A catalytic converter, comprising:
a catalyst including:
a support that is pre-sintered;
platinum group metal (PGM) particles dispersed on the support; and
a barrier formed on the support, the barrier disposed between a first set of the PGM particles and a second set of the PGM particles to suppress aging of the PGM particles.

2. The catalytic converter as defined in claim 1, wherein the support and the barrier are independently selected from the group consisting of $Al_2O_3$, $CeO_2$, $ZrO_2$, $CeO_2$—$ZrO_2$, $SiO_2$, $TiO_2$, and combinations thereof.

3. The catalytic converter as defined in claim 1 wherein the first set of the PGM particles is in a first space and the second set of the PGM particles is in a second space, and wherein each of the first and second spaces has at least one dimension up to about 100 nm.

4. The catalytic converter as defined in claim 1 wherein the first set of the PGM particles is in a first space and the second set of the PGM particles is in a second space, and wherein each of the first and second spaces has at least one dimension ranging from about 3 nm to about 5 nm.

5. The catalytic converter as defined in claim 1 wherein the barrier has a height ranging from about 0.05X to about 10X, where X is a dimension of at least one of the first and second sets of the PGM particles.

6. The catalytic converter as defined in claim 1 wherein the barrier does not extend onto any of the PGM particles.

7. The catalytic converter as defined in claim 1 wherein the barrier is a continuous coating formed around each of the first and second sets of the PGM particles.

8. The catalytic converter as defined in claim 1, further comprising a monolith substrate having a honeycomb structure, wherein the catalyst is applied on interior surfaces of the honeycomb structure.

9. The catalytic converter as defined in claim 1 wherein the PGM particles are selected from the group consisting of palladium, platinum, rhodium, ruthenium, osmium, iridium, and combinations thereof.

10. A method of suppressing aging of platinum group metal (PGM) particles in a catalytic converter, the method comprising:
applying PGM particles to a support that is pre-sintered;
reducing a functional group on a surface of the PGM particles, thereby rendering the PGM particles non-reactive during a subsequent selective growth process; and
selectively growing a barrier on the support around the PGM particles.

11. The method as defined in claim 10 wherein selectively growing is accomplished by atomic layer deposition (ALD) or molecular layer deposition (MLD).

12. The method as defined in claim 11 wherein selectively growing is accomplished by ALD, and wherein a total number of ALD cycles is less than 20.

13. The method as defined in claim 11, further comprising:
i) performing one cycle of ALD or MLD;
ii) reducing an other functional group on the surface of the PGM particles, thereby rendering the PGM particles non-reactive during a subsequent cycle of ALD or MLD; and
iii) repeating i and ii.

14. The method as defined in claim 13 wherein the reducing of the functional group on the surface of the PGM particles is accomplished by exposing the PGM particles to a reducing environment at a temperature up to 400° C.

15. The method as defined in claim 14 wherein the reducing environment includes hydrogen gas, carbon monoxide gas, mixture of argon gas and carbon monoxide gas, or a mixture of argon gas and hydrogen gas.

16. The method as defined in claim 10 wherein the reducing of the functional group on the surface of the PGM particles is accomplished by exposing the PGM particles to a reducing environment at a temperature up to 400° C.

17. The method as defined in claim 16 wherein the reducing environment includes hydrogen gas, carbon monoxide gas, mixture of argon gas and carbon monoxide gas, or a mixture of argon gas and hydrogen gas.

18. A method for maintaining an operational temperature of a catalytic converter, the method comprising:
applying PGM particles to a support that is pre-sintered;
reducing hydroxyl functional groups on a surface of the PGM particles, thereby rendering the PGM particles non-reactive during atomic layer deposition (ALD) or molecular layer deposition (MLD); and
exposing the support, having the PGM particles thereon, to less than 20 cycles of ALD or MLD, thereby selectively growing a metal oxide barrier on the support around, and not on, the PGM particles.

* * * * *